United States Patent [19]

Lambeth

[11] Patent Number: 4,521,106
[45] Date of Patent: Jun. 4, 1985

[54] IMAGE SENSOR AND RANGEFINDER DEVICE WITH BACKGROUND SUBTRACTION USING INTERLACED ANALOG SHIFT REGISTER

[75] Inventor: David N. Lambeth, Webster, N.Y.

[73] Assignee: Eastman Kodak Company, Rochester, N.Y.

[21] Appl. No.: 409,259

[22] Filed: Aug. 18, 1982

[51] Int. Cl.³ .......................... G01C 3/10; G03B 7/08
[52] U.S. Cl. ......................................... 356/1; 354/403
[58] Field of Search .................. 356/1, 4, 5; 377/54; 250/201, 210, 211 J; 354/402, 403

[56] References Cited

U.S. PATENT DOCUMENTS 4,274,735 6/1981 Tamura et al. ........................ 356/1
4,283,137 8/1981 Tsunekawa et al. ............... 356/1 X

FOREIGN PATENT DOCUMENTS 1589779 5/1981 United Kingdom .

Primary Examiner—S. C. Buczinski
Assistant Examiner—John B. Sotomayor
Attorney, Agent, or Firm—Thomas H. Close

[57] ABSTRACT

A rangefinder device includes means for projecting a beam of light to illuminate a spot on an object in a scene, an image sensor having an array of photosensors for sensing an image of the scene, and signal processing means responsive to the photosignals from the photosensors for determining the relative location of the illuminated spot in the scene. The device includes an improved image sensor comprising an array of N photosensors for sensing the image of the scene and generating N photosignals in response thereto, and an analog shift register having 2N cells for receiving the photosignals, in parallel, into N alternate cells. The sensor is operated once with the light beam off and the photosignals generated thereby, representing the background illumination, are entered into the N alternate cells of the shift register. Then the contents of the shift register are shifted by one cell. Next, the sensor is operated with the beam on and the N photosignals, representing the background plus the light beam illumination, are entered into the shift register, with the result that the background signals are interlaced with the background plus light beam signals in the shift register. The photosignals are read out of the shift register serially, and the pairs of signals originating from each respective photosensor are differenced to yield a series of N photosignals free from background scene information. The difference signals are supplied serially to a peak detector to determine the location of the illuminated spot.

8 Claims, 9 Drawing Figures

IMAGE SENSOR AND RANGEFINDER DEVICE WITH BACKGROUND SUBTRACTION USING INTERLACED ANALOG SHIFT REGISTER

BACKGROUND OF THE INVENTION

Cross Reference to Related Applications

Reference is hereby made to the following copending U.S. patent applications filed on even date herewith:

U.S. patent application Ser. No. 409,256, entitled "Image Sensor and Rangefinder Device Having Background Subtraction with Paired Analog Shift Registers" by C. Anagnostopoulos;

U.S. patent application Ser. No. 409,257, entitled "Image Sensor and Rangefinder Device Having Background Subtraction with Bridge Network" by L. Frank and C. Anagnostopoulos; and U.S. patent application Ser. No. 409,258, entitled "Rangefinder Device with Serial Readout Linear Image Sensor and Peak Detector with Threshold Setting Means" by D. N. Lambeth.

FIELD OF THE INVENTION

The present invention relates to automatic rangefinders and image sensors therefor, and more particularly to such rangefinders of the type wherein a beam of light is projected on a scene to illuminate a spot on an object, and an image sensor senses the location of the spot in an image of the scene to determine the distance to the object in the scene.

DECRIPTION OF THE PROBLEM

In one type of automatic rangefinder, a beam of light is projected upon an object in a scene to form an illuminated spot on the object. An image of the scene, including the illuminated spot, is formed on a linear image sensor. The location of the illuminated spot along the image sensor is determined by the distance to the object in the scene. Such a rangefinding device finds application for example in an automatic focusing camera.

The general arrangement of elements and mode of operation of such a rangefinding device will be described with reference to FIG. 1. Means for projecting a beam of light is shown by way of example as a light emitting diode (LED) 10 and a lens 12. The beam is projected along a path 14 to illuminate a spot on an object $O_1$ in a scene. The scene is imaged by a second lens 16 onto an image sensor comprising a linear array of photosensors 18. The signals produced by the photosensors are analyzed by control electronics 20 to determine the position of the illuminated spot in the scene and produce a signal representing the distance to the object.

As shown by example in FIG. 1, the apparent position of the illuminated spot in the scene is a function of distance along light path 14 to the object. For an object $O_1$ located at a distance $D_1$ from the rangefinding device, the image of the illuminated spot will fall on the image sensor at location $S_1$. For an object $O_2$ at a further distance $D_2$, the image of the spot will fall on the image sensor at location $S_2$. By examining the output of the image sensor, the control electronics determines (for example, by comparing the outputs of the elements to determine that output which is a maximum) the location of the illuminated spot in the scene and thereby the distance to the object.

When the ambient illumination is relatively bright, the scene itself, regardless of the illuminated spot, will produce substantial modulation of the photosensor array. Under such circumstances, it is not possible to determine the location of the illuminated spot merely by examining the outputs of the photosensors. The effects of ambient scene light can be removed however by operating the sensor with the beam off and again with the beam on, and subtracting the signals produced thereby. The information in the difference signal is solely from the illuminated spot. One way of accomplishing this subtraction is shown in U.S. Pat. No. 4,274,735 issued June 23, 1981 to Tamura et al. Tamura et al disclose a device having a pair of memory capacitors associated with each photosensor in the array. The capacitors are selectively connectable to the photosensors by field effect transistor (FET) switches, and each pair is further connectable to an associated differential amplifier. In operation, a photosensor is first connected to one of the capacitors while the light beam is off. The photosensor is then connected to the other capacitor while the light beam is on. Both the capacitors are then connected to the differential amplifier to produce a photosignal free from background information. The photosignals are compared in an array of comparators to determine the location of the illuminated spot by sensing the largest difference signal produced by the array of differential amplifiers.

To effectively remove the relatively large background photosignal from the relatively small photosignal due to the illuminated spot, each of the differential amplifiers must have very good common mode rejection. Furthermore, so that the amplifiers themselves do not introduce overwhelming pattern noise into the photosignals, they must be very closely matched. The need for a plurality of closely matched differential amplifiers exacts a high price on any attempt to increase the signal-to-noise ratio of the device. Furthermore, the use of an array of comparators to determine the maximum difference signal from the differential amplifiers complicates the signal processing circuitry.

An improvement over this method of background subtraction is described in U.S. patent application Ser. No. 409,256 entitled "Rangefinder Device Having Background Subtraction with Paired Analog Shift Registers" by C. Anagnostopoulos, filed on even date herewith. According to this disclosure, a pair of CCD shift registers is provided adjacent the array of photosensors, for selectively receiving, in parallel, the photosignals produced by the photosensors. The sensor is operated once with the light beam off and the background signals resulting therefrom are transferred to one of the shift registers. The sensor is operated again with the light beam on, and the background plus light beam signals are transferred to the other shift register. The two sets of signals are simultaneously read out of the shift registers, and the signals are differenced to yield a series of photosignals free from background scene information. The difference signals are supplied serially to a peak detector to determine the location of the illuminated spot. Although this scheme obviates the need for a plurality of closely matched differential amplifiers and comparators, thereby improving the signal-to-noise ratio of the rangefinder device, the signal-to-noise ratio achievable with the device is limited by the uniformity of the transfer gates for transferring signal charge from the photosensors into the CCD shift registers. If the transfer gates are not identical, the nonuniformity induces pattern noise in the difference signals which limits the signal-to-noise ratio achievable by the device.

Another problem with this image sensor is that at low ambient light levels, the signal-to-noise ratio of the linear image sensor is limited by the interface state traps in the transfer channels between the photosensors and the CCD shift register cells. These traps capture some of the charge carriers in each photosignal as the photosignals are transferred from the photosensors into the CCD shift registers. At high ambient light levels, this has little effect on the signal-to-noise ratio, since the number of charge carriers trapped is a small percentage of the total signal. However, at low ambient illumination levels, the number of traps may be a substantial percentage of the total number of charge carriers produced in the photosensors, and may even exceed the number of charge carriers produced. When this occurs, the signal-to-noise ratio of the rangefinder device is reduced, thereby decreasing the probability of correctly detecting the location of the illuminated spot in the image of the scene.

SOLUTION TO THE PROBLEM—SUMMARY OF THE INVENTION

The above-noted problems are solved according to my invention by providing the rangefinder device of the type described above with an improved image sensor.

The image sensor comprises an array of N photosensors for sensing the image of the scene and generating N photosignals in response thereto, and an analog shift register having 2N cells for receiving the photosignals in parallel into N alternate cells. The image sensor is operated once with the light beam off and the photosignals generated thereby, representing the background scene illumination are entered into N alternate cells of the shift register. The contents of the shift register are then shifted by one cell and the sensor is operated again, but this time with the light beam on. The N photosignals representing the background plus the light beam illumination are entered into the shift register, resulting in the shift register containing background signals interlaced with background plus light beam signals.

The photosignals are read out of the shift register serially, and the pairs of signals originating from the respective photosensors are differenced to yield a series of N difference signals free from background scene information. By processing both sets of signals through the same transfer gate, the noise introduced into the signals by nonuniformities in the transfer gate is removed during the differencing operation. The difference signals are supplied serially to a peak detector to determine the location of the illuminated spot.

In the preferred embodiment of the invention, the photosensors are photodiodes, the shift register is a buried channel CCD shift register and the photodiodes are coupled to the CCD shift register by surface channels formed by a transfer gate.

According to a further feature of the invention, the signal-to-noise ratio of the image sensor under low light operating conditions is improved by initializing the photosensors with a predetermined content of charge carriers. In a preferred embodiment of the invention, the means for introducing the predetermined charge content into the photosensors comprises a drain to which an adjustable bias voltage is applied, and a transfer gate disposed between the photosensor array and the drain. In operation, the transfer gate is lowered, and the drain is forward biased to fill the photosensors with charge. The bias on the drain is then reversed, to spill out the photocharge down to the level of the transfer gate, leaving a predetermined residual charge in the photosensors.

According to another feature of the invention, the peak detector comprises a reference capacitor, for holding a reference voltage, a comparator for comparing the value on the reference capacitor with the difference signal, and producing an output signal in response to the difference signal being greater than the value on the reference capacitor, and switching means for replacing the value on the reference capacitor with the signal value whenever an output signal is generated by the comparator. In the preferred embodiment of the invention, the peak detector includes means for storing a threshold value on the reference capacitor prior to peak detection.

BRIEF DESCRIPTION OF THE DRAWINGS

The invention will be described with reference to the accompanying drawings, wherein.

DESCRIPTION OF THE PREFERRED EMBODIMENTS

Figure 1:
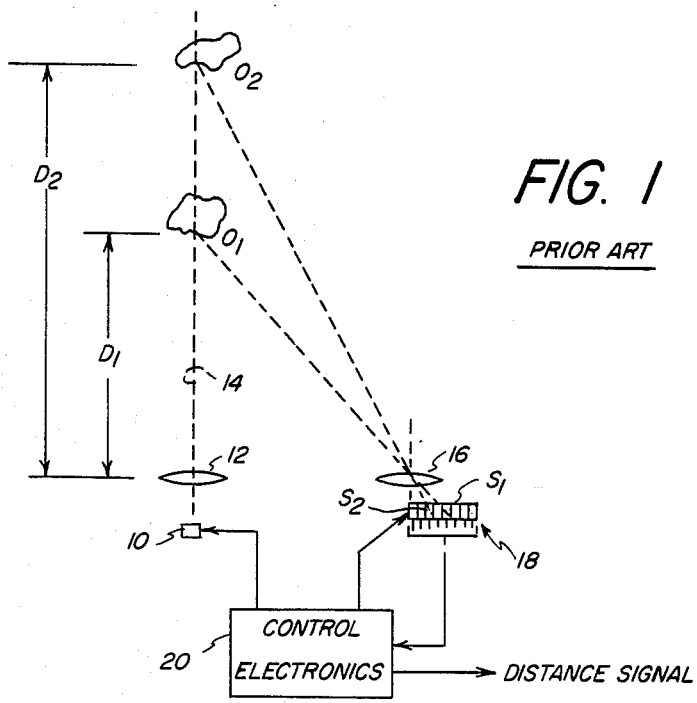
FIG. 1 is a schematic diagram of a rangefinder of the type to which the present invention pertains.
Figure 2:
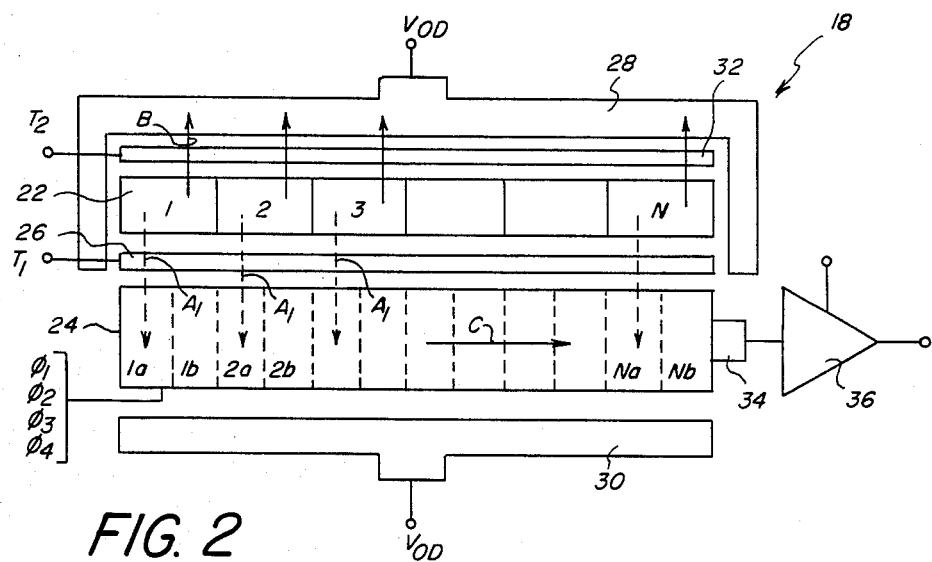
FIG. 2 is a schematic diagram of the image sensor including a photosensor array and an analog shift register according to the present invention.

Referring first to FIG. 2, a linear image sensor 18 according to the present invention is shown. The image sensor includes a linear array of N photosensors such as photodiodes 22 and a charge coupled device (CCD) shift register 24. The CCD shift register has 2N cells labeled 1a, 1b, 2a, 2b, Na, and Nb. A transfer gate 26 between the array of photosensors 22 and CCD shift register 24 is actuable for transferring photocharge (in the direction of arrows A) from the sensor elements into alternate cells (those subscripted with an "a") of the shift register 24. A second transfer gate 32 between the photosensor array 22 and the reset drain 28 is actuable for transferring photocharge (in the direction of arrows B) from the sensor elements into the reset drain 28. In the preferred embodiment of the invention, the CCD shift register is of the buried channel variety to maximize its transfer efficiency and hence the signal-to-noise ratio of the device, and the transfer channels created by the transfer gate 26 are surface channels.

The signals in the CCD shift register 24 are shifted serially in the direction of arrow C to an output diode 34 by applying four-phase clock signals $\Phi_{1-4}$ to the transfer electrodes (not shown in FIG. 2) of the CCD shift register. The photosignals are detected at the output diode by a preamplifier 36.

Figure 3:
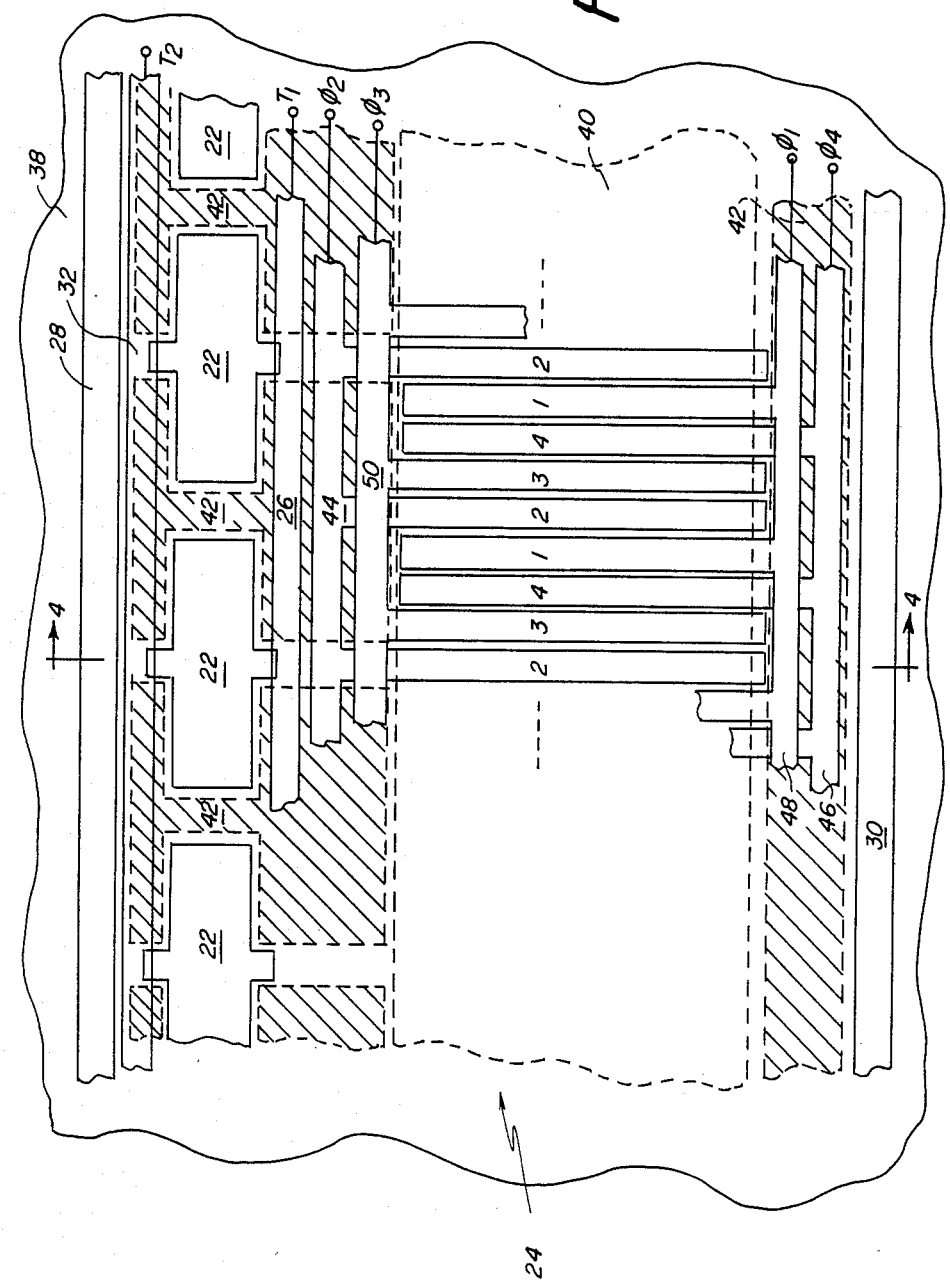
FIG. 3 is a partial plan view showing the electrode and channel structure of the image sensor shown in FIG. 2.

FIG. 3 is a partial plan view illustrating the electrode and channel structures of a presently preferred embodiment of the image sensor 18, showing the linear array of photosensors 22 and the associated buried channel CCD readout shift register 24. The device was constructed using well-known MOS fabrication techniques on a p-type silicon substrate 38. The buried channel for the CCD shift register 24, comprising for an example an n-type region 40 in the p-type silicon substrate 38 is shown by dotted lines. Channel stopping regions 42 and 42' confine the CCD shift register and photodiodes 22 and comprise for example (p+)-type regions under a thickened field oxide (shown by the shaded regions). The photodiodes 22 are formed by (n+)-type diffusions in the areas defined between the channel stopping regions 42'. Reset drain 28 and scavenger drain 30 are formed by (n+)-type regions in the substrate.

Two levels of polysilicon, overlying the channels, define the electrode structure of the device. A first level of polysilicon defines the phase-2 and phase-4 electrodes (44 and 46 respectively) of the CCD shift register, and the transfer gate 32. A second level of polysilicon defines the phase-1 and phase-3 electrodes (48 and 50 respectively) of the CCD shift registers and the transfer gate 26. Alternate phase-2 electrodes 44 and the transfer gate 26 form surface channels that couple the photodiodes 22 to alternate cells of the CCD shift register. The transfer gate 32 forms a surface channel coupling the photodiodes to the reset drain 28.

Figure 4:
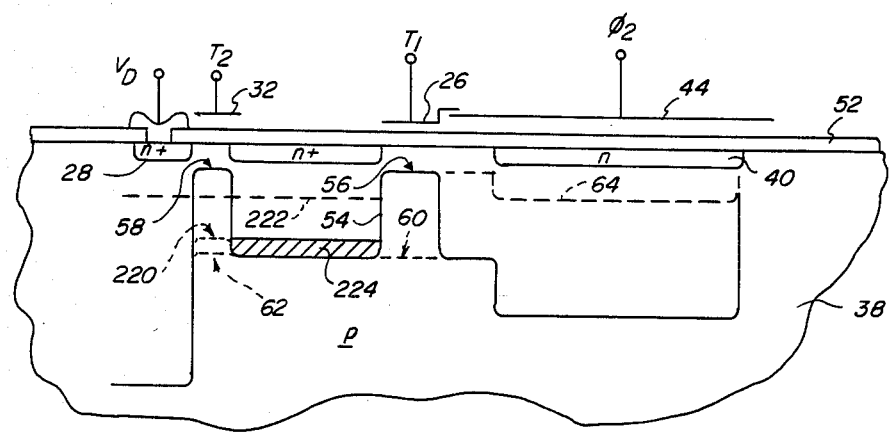
FIG. 4 is a schematic cross-sectional view and potential diagram of the image sensor taken along line 4—4 in FIG. 2.

FIG. 4 is a partial, cross-sectional view of the image sensor taken along lines 4—4 in FIG. 3, showing the channel structure of the sensor array. Sensor array 18 is formed in a p-type silicon substrate 38. The CCD buried channel is defined by n-type region 40. The photodiodes are formed by (n+)-type regions 22. A layer of silicon dioxide 52 overlies the doped regions of the device.

Solid line 54 depicts the potential profile across the device when 0 volts is applied to the transfer gates 26 and 32 and 5 volts is applied to the phase-2 electrode 44. Potential barriers 56 and 58 keep photocharge generated in the photodiode from flowing into either the CCD shift register or the drain. If approximately 5 volts is applied to either transfer gate 26 or 32, the potential barrier thereunder is lowered to the position shown by dotted lines 60 or 62 respectively and allows the photocharge in the photodiode to flow into the CCD shift register beneath the phase-2 electrode via the surface channel created under transfer gate 26 or into the drain via the surface channel created under transfer gate 32. When the 5-volt potential is removed from transfer gate 26 and the phase-2 electrode, the potential well thereunder collapses as shown by dotted line 64. Charge in the shift register is moved in a direction perpendicular to the plane of the drawing by pulsing the 4-phase transfer electrodes in the conventional manner for moving charge in a CCD shift register.

Figure 5:
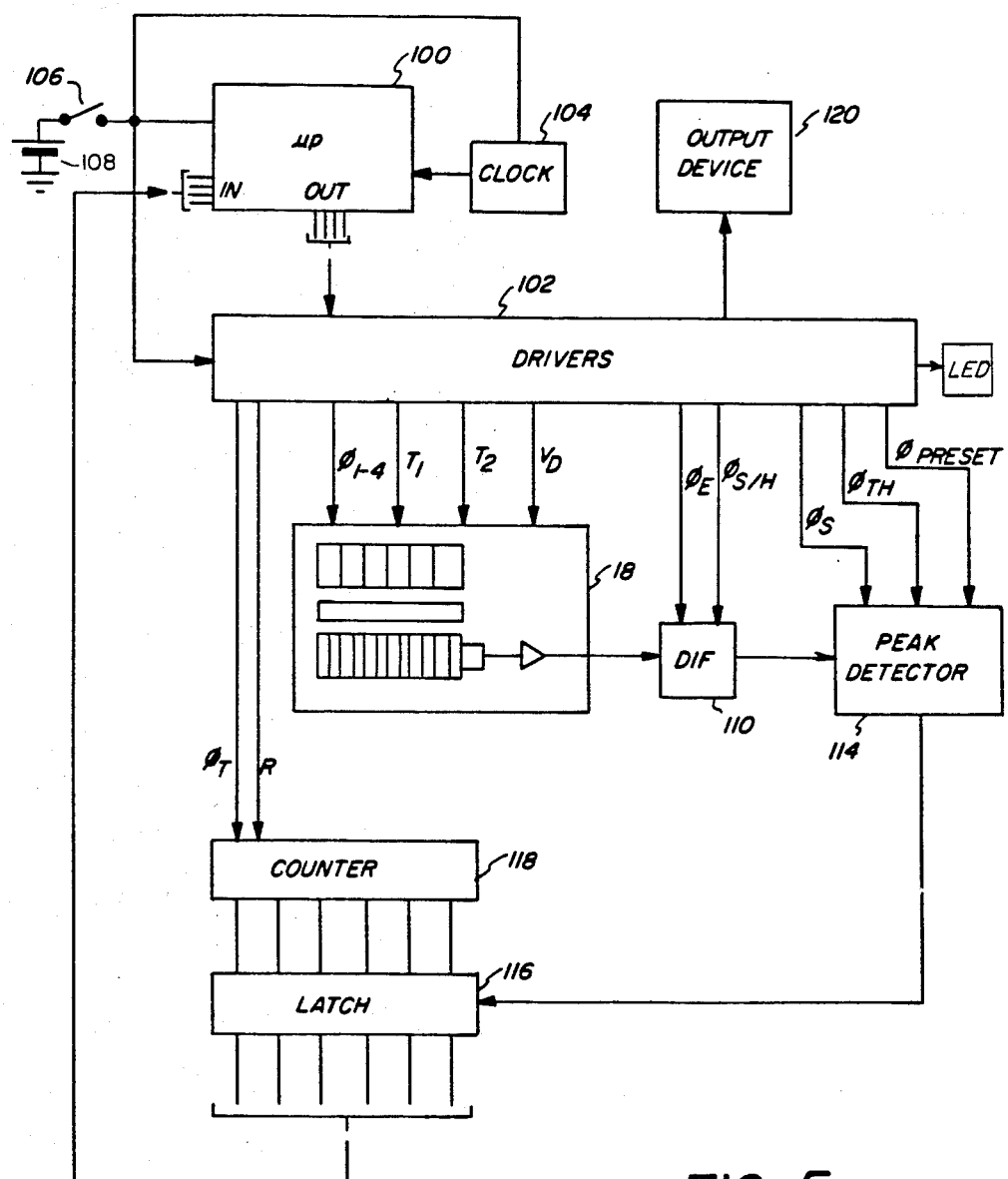
FIG. 5 is a schematic block diagram showing the signal processing and control electronics of a rangefinder according to the present invention.

Referring now to FIG. 5, overall control of the rangefinder is provided by a programed microprocessor 100 via conventional driver circuits 102. The microprocessor is supplied with timing signals from a clock circuit 104 and with power via a main power switch 106 from a battery 108. Four-phase clock signals $\Phi_{1-4}$ and transfer signals $T_1$ and $T_2$ and drain bias voltage $V_D$ are supplied to the linear sensor array 18 from driver 102 under control of microprocessor 100 to produce output signals from the CCD shift register of the sensor 18. The signals from the CCD shift register are supplied to a differencing circuit 110. Difference signals produced by the differencing circuit 110 are supplied to a peak detector circuit 114. Features of the peak detector circuit are claimed in copending U.S. patent application Ser. No. 409,258, entitled "Rangefinder Device with Serial Readout Linear Image Sensor and Peak Detector with Threshold Setting Means" filed on even date herewith by D. N. Lambeth. The output of the peak detector circuit is supplied to a latch circuit 116. Latch circuit 116 is connected to the outputs of a digital counter 118. Counter 118 receives a reset signal R and a timing signal $\Phi_T$ having the same frequency as the four-phase clock signals $\Phi_{1-4}$. The output of the latch circuit 116 is supplied to an input port of microprocessor 100.

The driver circuits 102 also power the LED 10 and an output device 120 such as a range display or a range servo.

Figure 6:
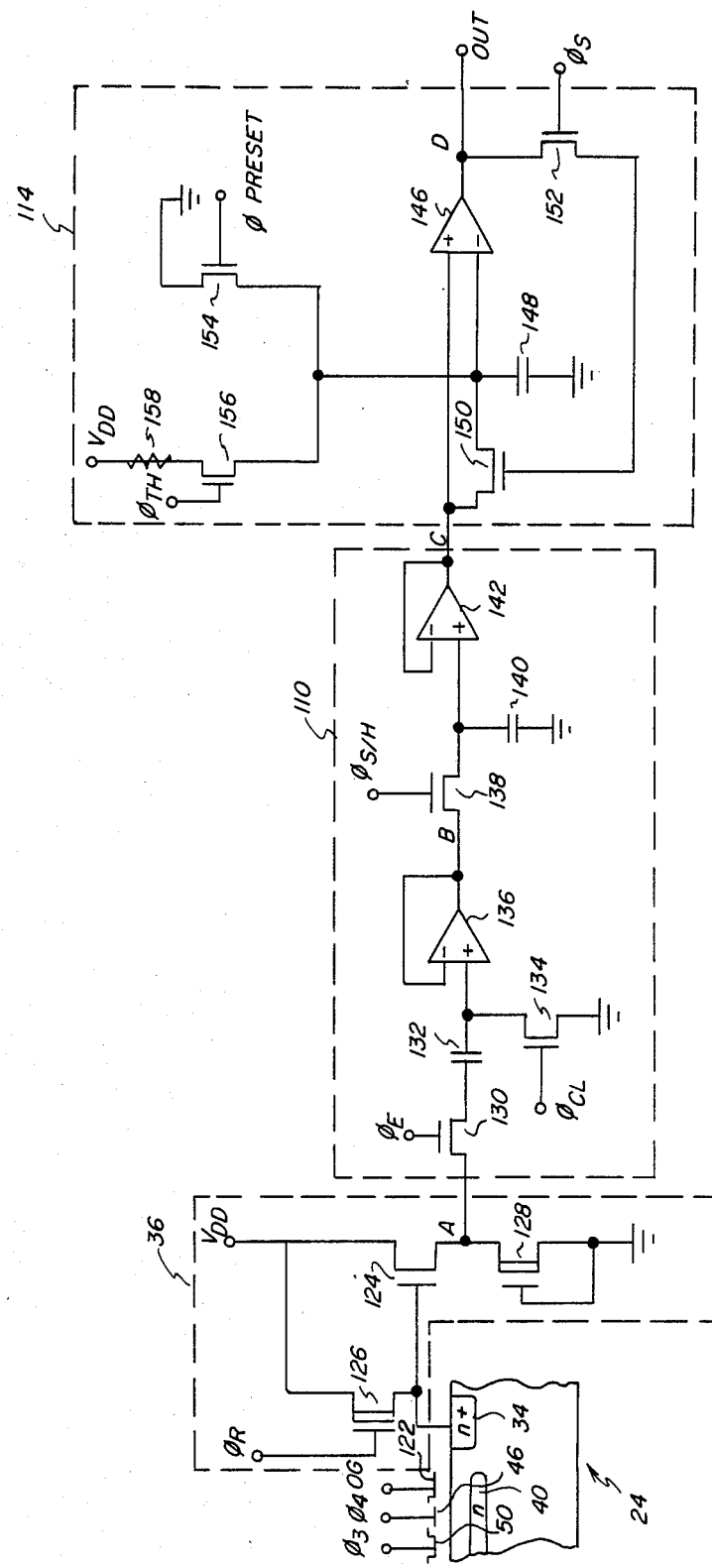
FIG. 6 is an electrical circuit schematic diagram showing the signal processing electronics for differencing and peak detecting according to the present invention.

FIG. 6 is a more detailed circuit schematic of the signal processing electronics shown in FIG. 5. A portion of the CCD shift register 24 showing output gate 122 and output diode 34 is included.

The output amplifier 36 is an on-chip, sense and reset amplifier including a sense FET 124 and a reset FET 126. The sense FET 124 is a surface channel device and the reset FET 126 is a buried channel device. A buried channel FET 128 is connected between the drain of the FET 124 and ground in a constant current configuration for converting the sensed charge on diode 34 to a voltage at node A.

The differencing circuit 110, comprises a first sampling FET 130 for sampling the output at node A, a detection capacitor 132, a clamping FET switch 134, and an amplifier 136. Differencing circuit 110 includes a sample and hold portion comprising a second sampling FET 138, a storage capacitor 140 and an amplifier 142.

The peak detector circuit 114 comprises a differential amplifier 146, a reference capacitor 148, a sampling FET switch 150, and a timing FET switch 152. The peak detector circuit contains a threshold setting portion comprising a preset FET switch 154 connecting capacitor 148 to ground, and a threshold setting FET switch 156 connecting the supply voltage $V_{DD}$ to capacitor 148 through a resistor 158.

Figure 8:
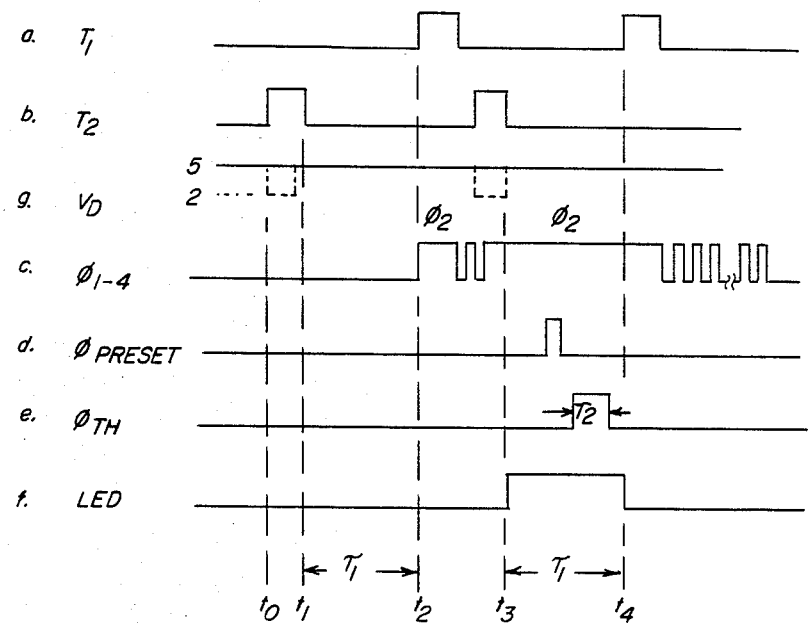
FIGS. 8 and 9 are timing diagrams useful in explaining the operation of the rangefinder according to the present invention.
Figure 7:
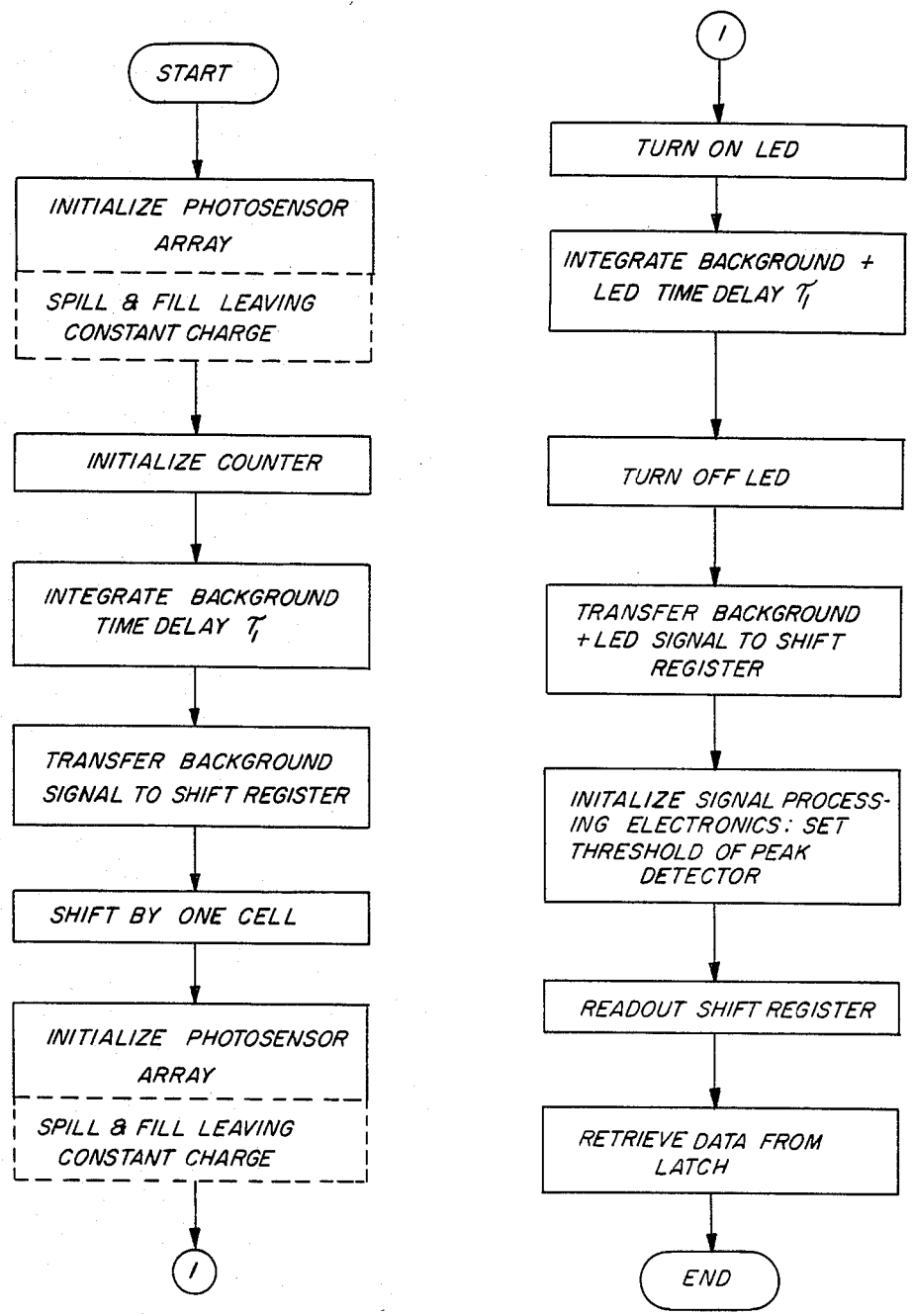
FIG. 7 is a flow chart showing the general operation of the rangefinder according to the present invention.
Figure 9:
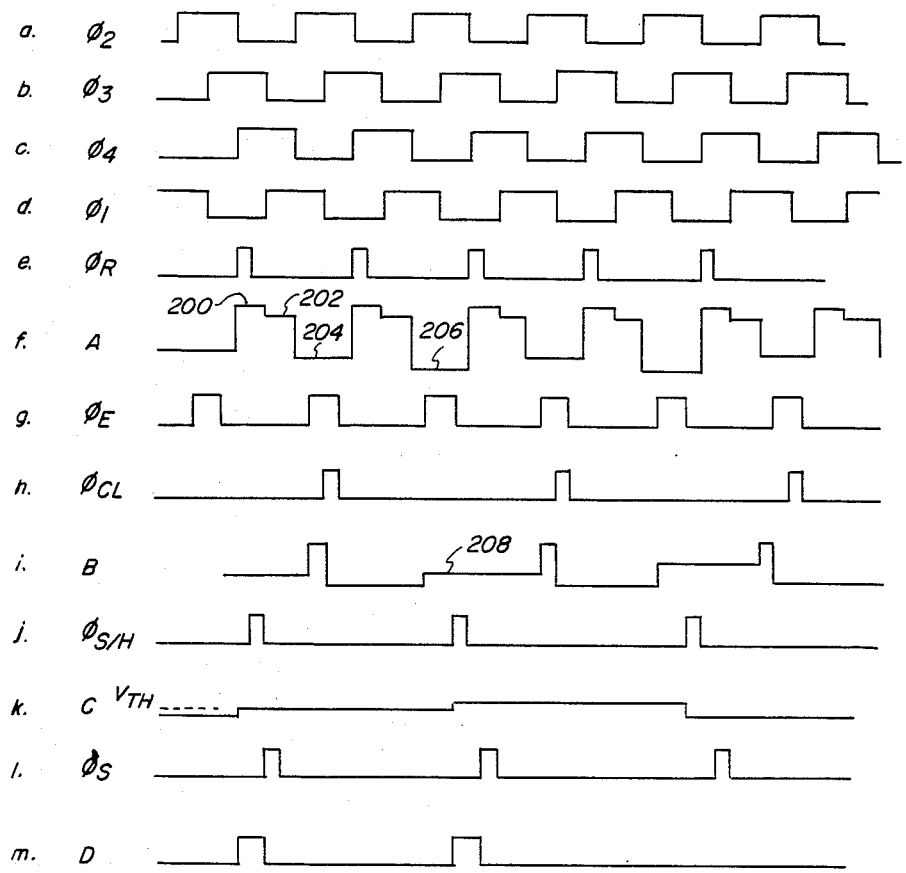

The operation of the rangefinder will now be described with reference to FIGS. 7, 8 and 9. FIG. 7 is a flow chart showing a control program for the microprocessor 100 (see FIG. 5). To begin, for example upon closure of main power switch 106 at time $t_0$, (see FIG. 8) the microprocessor initializes the photosensor array by transferring any accumulated photocharge from photosensors 22 into drain 28 by applying a $T_2$ transfer pulse to transfer gate 32, (FIG. 8b). At time $t_1$ after the transfer pulse, the microprocessor executes a time delay $\tau_1$ to accumulate background photocharge due to ambient scene illumination in the photosensor array. After time delay $\tau_1$, at time $t_2$, the "background" photocharge is transferred to the CCD shift register 24 by holding $\Phi_2$ high and pulsing transfer gate 26 with a $T_1$ pulse (see FIGS. 8a and c).

The microcomputer then commands a sequence of four phase clock pulses to advance all the photosignals in the CCD shift register by one cell, leaving the photosignals under them in the alternate phase-2 electrodes between the photosensors (see FIG. 8c). The photosensor array is again initialized by applying a T$_2$ transfer pulse to transfer gate 32 (see FIG. 8b).

Next, at time t$_3$, the microprocessor turns on LED 10 (see FIG. 5), while $\Phi_2$ is held high (see FIGS. 8c and 8f). LED 10 is kept on for a time $\tau_1$, during which, the signal processing circuitry is initialized to set the threshold of the peak detector. FET switch 154 (see FIG. 6) is turned on momentarily by generating a $\Phi_{preset}$ pulse (see FIG. 8d) to ground capacitor 148. Then, a pulse $\Phi_{TH}$ is applied to the threshold setting FET switch 156 for a time $\tau_2$ (see FIG. 8e) to charge capacitor 148 to a value determined by the time constant of resistor 158 and capacitor 148. At time t$_4$, the LED is turned off and the "background plus LED" photosignals generated by the sensor array are transferred to the CCD shift register 24 by applying a pulse T$_1$ to transfer gate 26 (see FIG. 8a). The CCD shift register 24 now contains photosignals representing background illumination, interlaced with photosignals representing background plus LED illumination. The CCD shift register 24 is then read out to generate the range signal by applying the four-phase clock signals $\Phi_{1-4}$ to the four-phase transfer electrodes 44, 46, 48, and 50 (see FIG. 8c).

Alternatively, the effects of varying ambient light levels, such as the flicker experienced under fluorescent illumination, are removed by a synchronous detection scheme. The image sensor is operated once with the light beam on and once with the light beam off as described above, but then the accumulated photocharges are shifted back one cell in the shift register, and the whole cycle is repeated several times, thereby averaging out any fluctuation in the ambient illumination.

Processing of the photosignals from the CCD shift register will now be described with reference to FIG. 9. The four-phase clock signals $\Phi_{1-4}$ are shown in FIGS. 9a–d. While the signal charges reside under the phase-3 and phase-4 electrodes, 50 and 48 respectively, ($\Phi_3$ and $\Phi_4$ simultaneously high) a reset pulse $\Phi_R$ is applied to buried channel FET transistor 126 to prepare the output diode to receive the first signal charge. The first signal charge that is read out represents the background illumination sensed by the Nth photosensor in the array. When the reset pulse is applied to the FET 126, the voltage at node A goes to a high level (200 in FIG. 9f). When the phase-3 transfer gate goes low, some of the signal charge spills over the output gate onto the output diode, and the output goes to the intermediate level 202 in FIG. 9f. Finally, when the phase-four transfer gate goes low, all the signal charge is moved to the output diode 28 and the output signal at node A goes to its final signal level 204 as shown in FIG. 9f.

While the final signal level is present at node A a pulse $\Phi E$ is applied to sampling transistor 130, thereby storing the background level at node A on capacitor 132 (see FIG. 9f). Immediately thereafter, a pulse $\Phi CL$ is applied to clamping transistor 134 to establish this voltage as a reference on capacitor 132.

The next signal charge is then read out, representing the background plus the LED signal. The final voltage 206 (see FIG. 9f) at node A represents the background plus LED signal. This voltage is applied to capacitor 132 by pulsing FET transistor 130 with a pulse $\Phi E$. The resulting voltage 208 appearing at node B (see FIG. 9i) is the difference between the "background" signal and the "background plus LED" signal. The difference signal 208 is sampled and held on the output of amplifier 142 at node C by pulsing FET 133 with a sampling pulse $\Phi S/H$ (see FIG. 9j).

The voltage at node C is a step-wise smooth curve representing the successive values of the difference signal (see FIG. 9k). Differential amplifier 146 compares the first difference signal value with a threshold value V$_{TH}$ (see FIG. 9k) stored on capacitor 148. If the sampled value is less than the threshold value, the output of amplifier 146 at node D remains low, however if the sampled value exceeds the threshold value, the output at node D goes high. At a point during the sample period, a sampling signal $\Phi_s$ (see FIG. 9l) is applied to FET transistor 152. If the voltage at node D is low at this time, the low value will be applied to the gate of transistor 150 and will have no effect upon the state of the circuit. If, however, the voltage at node D is high, the high value will be applied to the gate of transistor 150, thereby applying the new higher reference voltage to capacitor 148. The new reference value is equal to the input at node C, thereby causing the output at node D of differential amplifier 146 to go low (see FIG. 9m). This process continues, producing a pulse at node D each time a new greater difference signal is received from the difference circuit 110.

At the start of the sequence, counter 118 is initialized. Each time a new charge packet is read from the CCD shift registers, counter 118 is advanced (see FIG. 5). The pulse train produced by the peak detector at node D is applied to latch 116 which latches the output of counter 118 whenever a new pulse is produced by the peak detector. After all the charge packets in the CCD shift register have been read out, the count held by latch 116 is indicative of the location of the sensor element having the greatest illumination from the LED, above the threshold level. At this point, the microprocessor retrieves the range data from the latch by interrogating its input port.

The range data are then used in known manner to drive an output device such as a range display or a range servo.

At low ambient light levels, the signal-to-noise ratio of the linear image sensor is limited by the interface state traps in the surface channels connecting the photosensors to the CCD shift registers. These traps capture some of the charge carriers in each photosignal as the photosignals are transferred from the photosensors into alternate cells of the CCD shift register. At high ambient light levels, this has little or no effect on the signal-to-noise ratio, since the number of traps is a small percentage of the total number of charge carriers. About the same number of charge carriers are trapped from the "background" signal and from the "background plus LED" signal, leaving no net effect on the difference signals.

On the other hand, at low ambient light levels, the number of traps represents a substantial percentage of the total number of charge carriers produced in a photosensor, and may exceed the number of carriers produced. When this occurs, the signal-to-noise ratio is reduced, thereby decreasing the likelihood of correctly detecting the location of the illuminated spot in the scene.

According to a further feature of the present invention, the signal-to-noise ratio of the ranging device is further improved by initializing the photosensors, prior to each operation of the image sensor, with a constant charge. This has the effect of increasing the background illumination, thereby improving the signal-to-noise ratio of the sensor.

Referring now to FIGS. 4 and 8, when the photosensors are initialized, a transfer pulse $T_2$ is applied to transfer gate 32, to lower the potential barrier thereunder to the level 220 shown in FIG. 4. The voltage of transfer pulse $T_2$ is chosen such that this level is slightly higher than the level 60 to which the barrier under transfer gate 26 is lowered when transferring charge from the photosensor into the CCD array. With the potential barrier under transfer gate 32 lowered to level 220, the bias voltage $V_D$ is momentarily changed on drain 28 (e.g. from 5 volts to 2 volts, see pulses indicated in phantom in FIG. 8g) to fill the photodiode 22 with charge, up to level 222 shown in FIG. 4. The bias voltage $V_D$ is then returned to its normal value (e.g. 5 volts) and excess charge spills from photodiode 22 over barrier 220, leaving behind a constant charge 224, indicated by shading in FIG. 4. This spill and fill technique is employed each time the photosensors are initialized. This alternative step is indicated in phantom in FIG. 7.

Alternatively, a constant charge can be accumulated in the photosensors by emptying the photosensors of charge, then exposing the photosensors directly to a source of illumination, such as an LED, for a predetermined constant time, or by uniformly illuminating the scene, for example, by electronic flash, each time the image sensor is operated.

Another means for providing an initial charge in the photosensors is to sense the ambient illumination level, and when it is low, to operate the sensor for longer times, thereby allowing dark current to accumulate in the photosensors.

Thus a rangefinding device has been disclosed having an improved image sensor and simplified signal processing electronics and affording improved signal-to-noise ratio.

The invention has been described with reference to a preferred embodiment thereof, however, it will be apparent that changes and modifications can be effected within the spirit and scope of the accompanying claims.

What is claimed is:

1. A rangefinder, comprising:
   means energizable for projecting a beam of light to illuminate a spot on an object in a scene;
   a linear array of N photosensitive elements responsive to incident light for generating photosignals;
   means for forming an image of a portion of the scene containing the illuminated spot on said array;
   analog shift register means having 2N cells for receiving, in parallel, N analog signals into N alternate cells, and responsive to clock signals for shifting said analog signals serially toward an output location;
   first transfer means responsive to a control signal for transferring N photosignals generated by said array into the N alternate cells of said analog shift register;
   control means for (1) energizing said light beam and generating photosignals in said array, (2) sending a control signal to said first transfer means to transfer photosignals into said analog shift register means from said array, (3) deenergizing said light beam and generating photosignals in said array, (4) supplying clock signals to said analog shift register means to shift said photosignals by one cell, (5) sending a control signal to said first transfer means to transfer photosignals into said analog shift register means, and (6) supplying clock signals to said analog shift register means to shift the photosignals therein serially to the output location; and
   signal processing means, including means for (1) receiving said photosignals and forming a series of difference signals representative of the difference between the responses of Nth photosensitive element with the light beam energized and with the light beam deenergized, and (2) detecting the location of the image of said illuminated spot based on the magnitude of said difference signals, and forming a range signal based on the detected location of said illuminated spot.

2. The invention claimed in claim 1, further comprising means for establishing a predetermined signal content in said photosensitive elements prior to generating photosignals in said array.

3. The invention claimed in claim 2, wherein said predetermined signal content is zero signal.

4. The invention claimed in claim 2, wherein said predetermined signal content is a constant, non zero signal.

5. The invention claimed in claim 2, wherein said photosensitive elements are photodiodes, said analog shift register means is a buried channel charge coupled device (CCD) shift register having alternate cells aligned with said photodiodes, said first transfer means is a first transfer gate responsive to a control signal for forming surface channels between said photodiodes and said alternate cells of said CCD shift register, and wherein said means for introducing a predetermined signal into said photodiodes comprises drain means adjacent said array of photodiodes and a second transfer gate responsive to a control signal for coupling the photodiodes to said drain.

6. The invention claimed in claim 1, wherein said means for detecting the location of the image of said illuminated spot comprises peak detector means responsive to the difference signals for producing a pulse each time a new greater difference signal is received, said peak detector means comprising a storage capacitor for storing the last greatest difference signal, comparator means for comparing the voltage on said storage capacitor with the next difference signal and producing an output pulse whenever said next difference signal is greater than the value on said storage capacitor, and switching means responsive to said output pulse for replacing the signal on said storage capacitor with said greater difference signal.

7. The invention claimed in claim 6, further comporising means for introducing a threshold value onto said storage capacitor prior to the operating of said detecting means.

8. A rangefinder device of the type having means for projecting a beam of light to illuminate a spot on an object in a scene, an image sensor for sensing the light from the scene and producing photosignals representative thereof, and means responsive to the photosignals for detecting the position of the illuminated spot in the scene to determine the distance to the object, said rangefinder device including means for removing background noise from the photosignals produced by said image sensor, by sensing the scene with the light beam on and again with the light beam off, and forming difference signals from the photosignals produced thereby, characterized in that said image sensor includes: (1) a linear array (22) of N photosensitive elements; (2) an analog shift register (24) adjacent said linear array and having 2N cells, for receiving, in parallel, N analog signals into N alternate cells; and (3) transfer gate means (26) disposed between said array and said shift register and actuable for transferring the N photosignals produced by said array into said N alternate cells of said shift register, whereby, the photosignals produced with the light beam on may be entered into said shift register and shifted one cell, then the photosignals produced with the light beam off are entered into the shift register, interlaced with said photosignals produced with the light beam on, and the photosignals are delivered serially to a differencing circuit.

* * * * *